United States Patent
Chen et al.

(10) Patent No.: US 11,710,811 B2
(45) Date of Patent: Jul. 25, 2023

(54) DISPLAY SUBSTRATE, ON-BOARD DISPLAY DEVICE AND METHOD FOR MANUFACTURING THE DISPLAY SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chenyu Chen, Beijing (CN); Yuhsiung Feng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 227 days.

(21) Appl. No.: 16/910,747

(22) Filed: Jun. 24, 2020

(65) Prior Publication Data

US 2021/0193887 A1 Jun. 24, 2021

(30) Foreign Application Priority Data

Dec. 18, 2019 (CN) .......................... 201911310940.X

(51) Int. Cl.
*H01L 33/58* (2010.01)
*B60K 35/00* (2006.01)
(Continued)

(52) U.S. Cl.
CPC .............. *H01L 33/58* (2013.01); *B60K 35/00* (2013.01); *G02B 27/0101* (2013.01);
(Continued)

(58) Field of Classification Search
CPC ............ B60K 35/00; B60K 2370/1529; G02B 27/0101; H01L 33/58; H01L 33/54
See application file for complete search history.

(56) References Cited

U.S. PATENT DOCUMENTS

2011/0128470 A1* 6/2011 Yorita ............... G02F 1/133606
359/613
2018/0364412 A1 12/2018 Yao
2019/0393283 A1* 12/2019 Lu .......................... G06V 40/13

FOREIGN PATENT DOCUMENTS

CN 102193238 A 9/2011
CN 107132694 A 9/2017
(Continued)

OTHER PUBLICATIONS

Office Action of CN Application No. 201911310940.X and English translation, 16 pages.

*Primary Examiner* — Jay C Chang
*Assistant Examiner* — Mikka Liu
(74) *Attorney, Agent, or Firm* — Muncy, Geissler, Olds & Lowe, P.C.

(57) ABSTRACT

A display substrate is provided, which includes a base substrate, a plurality of pixel units arranged on the base substrate, and a function layer arranged at a light-emitting side of at least one pixel unit of the plurality of pixel units, wherein the function layer is configured to shield a light beam toward a first direction among light beams emitted by the at least one pixel unit, the function layer includes an organic layer and a light-shielding layer, and the light-shielding layer is arranged on a part of the organic layer, and configured to shield the light beam toward the first direction among the light beams emitted by the at least one pixel unit. An on-board display device and a method for manufacturing the display substrate are further provided.

16 Claims, 3 Drawing Sheets

(51) Int. Cl.
*G02B 27/01* (2006.01)
*H01L 25/075* (2006.01)
*H01L 33/54* (2010.01)

(52) U.S. Cl.
CPC .......... *H01L 25/0753* (2013.01); *H01L 33/54* (2013.01); *B60K 2370/1529* (2019.05); *H01L 2933/005* (2013.01); *H01L 2933/0058* (2013.01)

(56) References Cited

FOREIGN PATENT DOCUMENTS

| | | | | |
|---|---|---|---|---|
| CN | 107170791 A | | 9/2017 | |
| CN | 109148719 A | * | 1/2019 | ............. G09F 9/301 |
| CN | 109188771 A | | 1/2019 | |
| CN | 110459692 A | | 11/2019 | |

\* cited by examiner

DISPLAY SUBSTRATE, ON-BOARD DISPLAY DEVICE AND METHOD FOR MANUFACTURING THE DISPLAY SUBSTRATE

CROSS-REFERENCE TO RELATED APPLICATION

The present application claims a priority of the Chinese patent application No. 201911310940.X filed in China on Dec. 18, 2019, which is incorporated herein by reference in its entirety.

TECHNICAL FIELD

The present disclosure relates to the manufacture of a display product, in particular to a display substrate, an on-board display device, and a method for manufacturing the display substrate.

BACKGROUND

Usually, for an on-board display panel, due to a projection principle, a corresponding projection image is easily generated on a windshield of a vehicle, so a driver or any other user may be easily distracted by the projection image on the windshield. To solve this problem, usually a light control film is attached onto the display panel, so as to reduce the quantity of light beams generated by the display panel and reflected by the windshield toward user's eyes. However, this may lead to a light loss of about 20% to 40% for the display panel, and an increase in a thickness of the display panel.

SUMMARY

An object of the present disclosure is to provide a display substrate, an on-board display device, and a method for manufacturing the display substrate, so as to solve the above problems.

In view of the above, in one aspect, the present disclosure provides in some embodiments a display substrate, including a base substrate, a plurality of pixel units arranged on the base substrate, and a function layer arranged at a light-emitting side of at least one pixel unit of the plurality of pixel units. The function layer is configured to shield a light beam toward a first direction among light beams emitted by the at least one pixel unit, the function layer includes an organic layer and a light-shielding layer, and the light-shielding layer is arranged on a part of the organic layer, and configured to shield the light beam toward the first direction among the light beams emitted by the at least one pixel unit.

In a possible embodiment of the present disclosure, the organic layer includes at least one protrusion, each of the at least one protrusion is arranged on a respective one of the at least one pixel unit, and a respective light-shielding layer is arranged on a first portion of each protrusion.

In a possible embodiment of the present disclosure, the first portion of each protrusion is a curved-surface structure protruding in the first direction, and the first direction is a direction away from the base substrate.

In a possible embodiment of the present disclosure, the light-shielding layer on each first portion includes a first end adjacent to the base substrate and a second end distal to the base substrate, and an angle of a connection line relative to a direction perpendicular to the base substrate is a first angle, wherein the connection line connects the second end of the light-shielding layer and the first end of another light-shielding layer adjacent to the light-shielding layer, an angle $\theta_0$ of the first end of the light-shielding layer adjacent to the base substrate relative to a plane where the base substrate is located is calculated through equations $$\tan\theta_0 = \frac{h_2}{x} \text{ and } \tan\theta_1 = \frac{p-x}{h_2},$$

where $h_2$ represents a distance between the first end of the light-shielding layer and the second end of the light-shielding layer in a direction perpendicular to the display substrate, p represents a length of the pixel unit in a row direction or a column direction in a pixel array, x represents a length of an orthogonal projection of the light-shielding layer onto the base substrate in a direction parallel to the base substrate, a direction of x is parallel to a direction of p, and $\theta_1$ represents the first angle.

In a possible embodiment of the present disclosure, the light beams emitted by the at least one pixel unit include first light beams toward the first direction and second light beams toward a second direction, an angle of a marginal light beam in the first light beams relative to a direction perpendicular to the base substrate is a second angle, the marginal light beam is adjacent to the second light beams, and the second angle is the same as the first angle.

In a possible embodiment of the present disclosure, the second direction is a direction toward a user's eye, and the second light beams toward the second direction are not shielded by the function layer.

In a possible embodiment of the present disclosure, the light-shielding layer is made of a black light-resistant material.

In a possible embodiment of the present disclosure, the pixel unit includes an anode, a pixel light-emitting layer and a cathode arranged sequentially in the direction away from the base substrate, and a thin film encapsulation layer encapsulating the anode, the pixel light-emitting layer and the cathode, and the organic layer is formed on the thin film encapsulation layer.

In a possible embodiment of the present disclosure, the organic layer is in direct physical contact with the thin film encapsulation layer, the light-shielding layer is merely arranged on a surface of the first portion, and the surface of the first portion is not in direct physical contact with the thin film encapsulation layer, to merely shield the light beam toward the first direction among the light beams emitted by the pixel unit.

In another aspect, the present disclosure provides in some embodiments an on-board display device including the above-mentioned display substrate.

In a possible embodiment of the present disclosure, the display substrate is an on-board display substrate, and the first direction is a direction toward a windshield of a vehicle with the on-board display device.

In yet another aspect, the present disclosure provides in some embodiments a method for manufacturing a display substrate, including: forming a plurality of pixel units on a base substrate; forming a thin film encapsulation layer on the pixel units; and forming a function layer on the thin film encapsulation layer to shield a light beam toward a first direction among light beams emitted by at least one pixel unit of the plurality of pixel units.

In a possible embodiment of the present disclosure, the forming the function layer on the thin film encapsulation layer to shield the light beam toward the first direction among the light beams emitted by the at least one pixel unit of the plurality of pixel units includes: forming an organic layer on the thin film encapsulation layer; exposing and developing the organic layer with a half-tone mask, to form a respective protrusion on the at least one pixel unit; and forming a light-shielding layer on a first portion of the protrusion.

DETAILED DESCRIPTION

Figure 1:
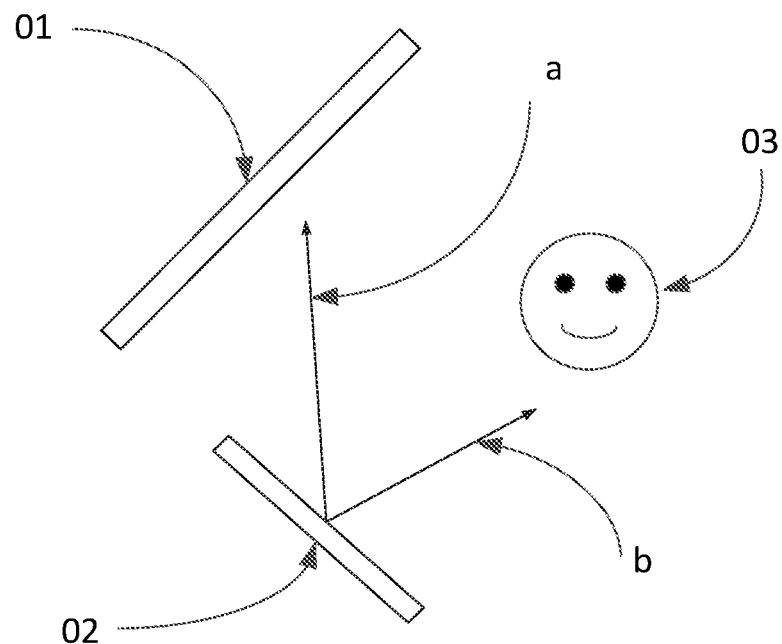
FIG. 1 is a schematic view showing the distribution of an on-board display and a windshield according to an embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the embodiments of the present disclosure, it should be appreciated that, such words as "in the middle of", "on/above", "under/below", "left", "right", "vertical", "horizontal", "inside" and "outside" may be used to indicate directions or positions as viewed in the drawings, and they are merely used to facilitate the description in the present disclosure, rather than to indicate or imply that a device or member must be arranged or operated at a specific position, and thus are not intended to limit the present disclosure. In addition, such words as "first", "second" and "third" may be merely used to differentiate different components rather than to indicate or imply any importance.

In the related art, as shown in FIG. 1, among light beams emitted by an on-board display panel 02, a first light beam a is directed toward a windshield 01 of a vehicle, and a second light beam b is a normal light beam capable of being directly recognized by eyes of a driver or any other user 03. Due to the first light beam a, a projection image may be generated on the windshield 01, so the driver or the other user 03 may be easily distracted. Usually, to solve this problem, a light control film is attached onto the display panel. However, usually the light control film is attached onto the display panel through an adhesive, and a particular light control film is supported by a substrate, so a thickness of the display panel may increase. In addition, when the light control film is attached onto the display panel, an alignment error may easily occur between the light control film and corresponding pixel units. In order to prevent the occurrence of the projection image on the windshield, usually a viewing angle is decreased, i.e., not only the light beams emitted by the on-board display panel that should have reached the windshield of the vehicle with the on-board display panel but also the light beams emitted by the on-board display panel that will not reach the windshield may be shielded. This may lead to a light loss for the display panel.

To solve the above problems, the present disclosure provides in some embodiments a display substrate, which includes a function layer 1 arranged on a pixel unit 200 and configured to shield a light beam toward a first direction among light beams emitted by the pixel unit 200. As compared with the light control film, the function layer 1 may be aligned with the pixel unit 200 in a more accurate manner, so it is able to more accurately shield the light beam toward the first direction rather than the light beams toward the other directions. In this way, it is able to prevent the occurrence of the light loss for the display panel. In addition, as compared with the light control film, no adhesive is to be provided, so it is able to reduce a thickness of the display panel.

Figure 2:
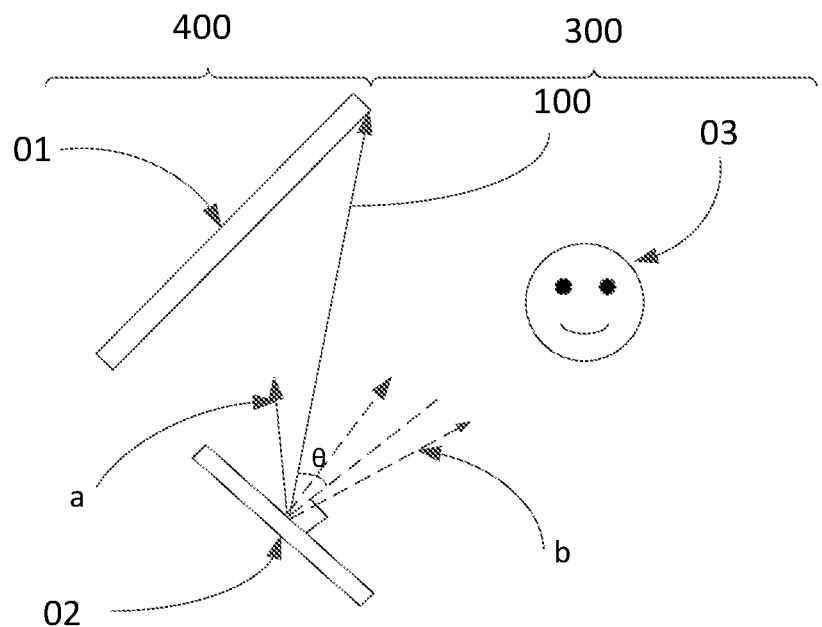
FIG. 2 is a schematic view showing the distribution of first light beams and second light beams according to an embodiment of the present disclosure.
Figure 3:
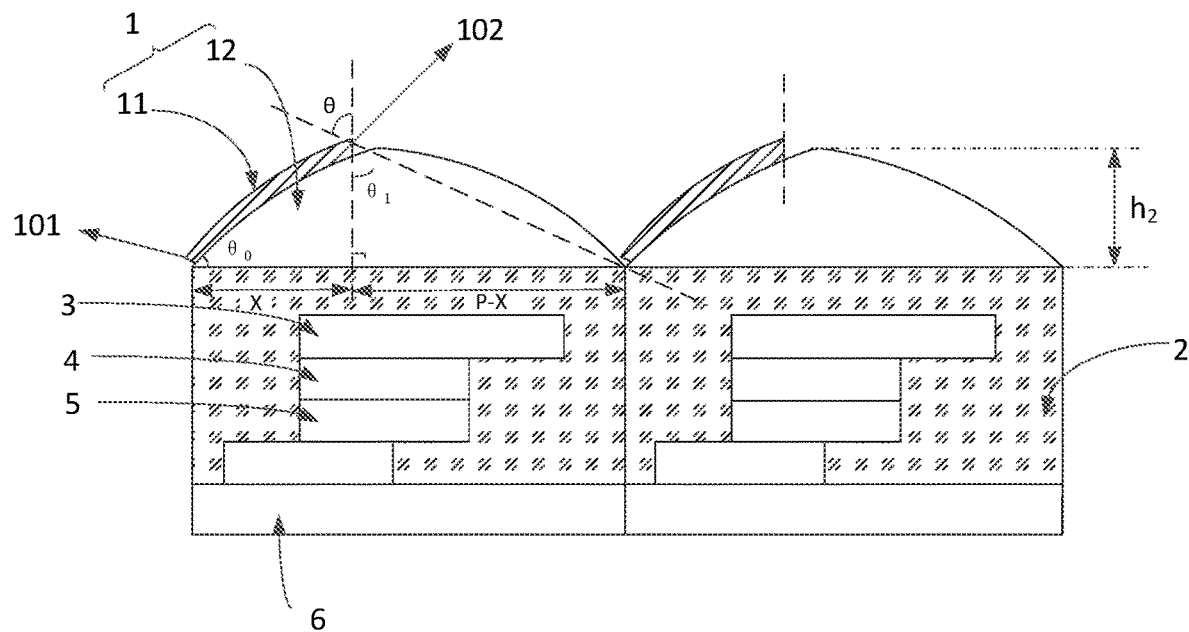
FIG. 3 is a schematic view showing a display substrate according to an embodiment of the present disclosure.

In particular, as shown in FIGS. 2 and 3, the present disclosure provides in some embodiments a display substrate, including a base substrate 6, a plurality of pixel units 200 arranged on the base substrate 6, and a plurality of function layers 6 arranged at a light-emitting side of at least one pixel unit of the plurality of pixel units 200 and configured to shield light beams toward a first direction among light beams emitted by the at least one pixel unit 200. The plurality of function layers 1 correspond to the plurality of pixel units 200 respectively. In the embodiments of the present disclosure, as shown in FIG. 3, the pixel unit 200 may include an anode 5, a pixel light-emitting layer 4 and a cathode 3 arranged sequentially in a direction away from the base substrate 6. In addition, the pixel unit 200 may further include a thin film encapsulation layer 2 encapsulating the anode 5, the pixel light-emitting layer 4 and the cathode 3.

During the manufacture of the display substrate, the function layer 1 may be directly formed at a light-exiting side of the pixel unit 200, so as to improve the manufacture accuracy, align the function layer 1 with the corresponding pixel unit 200 in a more accurate manner, and shield the light beams emitted by the pixel unit 200 in a more accurate manner. Hence, it is able to prevent the occurrence of the light loss for the display panel, and as compared with the light control film, it is unnecessary to apply any adhesive onto the display panel, thereby to reduce a thickness of the display panel.

Depending a position and a size of the function layer 1, the display substrate in the embodiments of the present disclosure may be applied to any display device where the light beams need to be shielded in a specific direction or a specific direction range. When the display substrate is used as an on-board display substrate, the first direction may be a direction toward a windshield of a vehicle with the display substrate, so the light beam toward the first direction may be just light beams toward the windshield. As shown in FIG. 2, the function layer 1 may shield the light beams toward the windshield, so as to prevent the occurrence of a projection image of the display panel on the windshield. All first light beams a toward the windshield may be the light beams toward the first direction. In FIG. 2, a marginal light beam 100 is a light beam adjacent to second light beams b (the second light beams b are normal light beams capable of being recognized by a user's eye) among the first light beams a toward the windshield. The light beams at a region 400 on the left of the marginal light beam 100 (including the marginal light beam 100) may belong to the light beams toward the first direction, and they may be shielded by the function layer. The light beams at a region 300 on the right of the marginal light beam 100 may be recognized by the user's eye normally (it should be appreciated that, in actual use, due to a height of the driver or the other user, the user's eye is not located at a fixed position, so emergent angles of the light beams capable of being received by the user's eye are within a certain range, rather than a fixed value). Detailed description will be given hereinafter when the display substrate in the embodiments of the present disclosure is an on-board display substrate.

Figure 4:
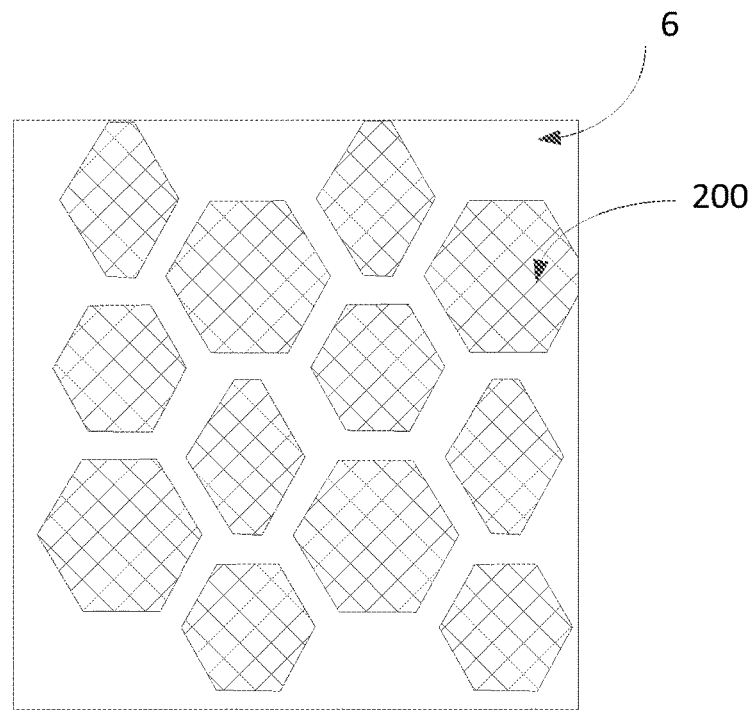
FIG. 4 is a schematic view showing the distribution of pixel units according to an embodiment of the present disclosure.
Figure 5:
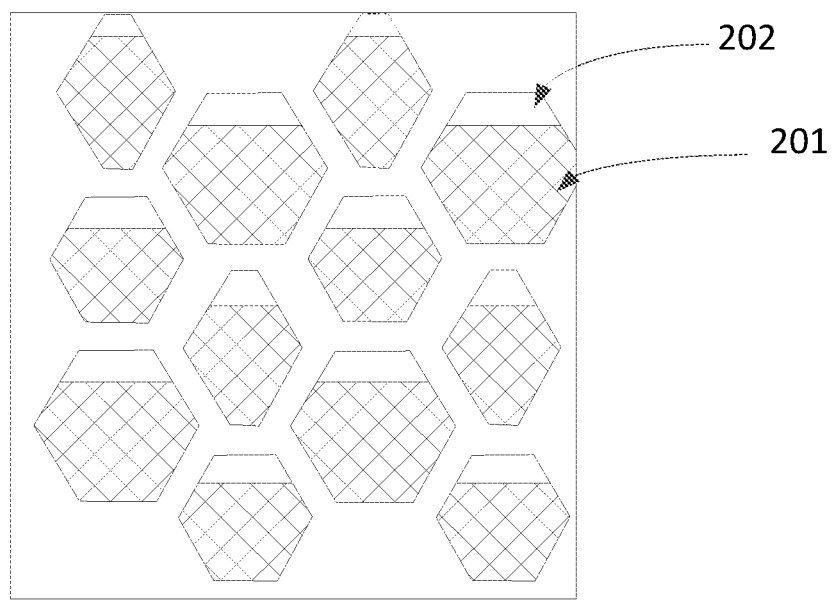
FIG. 5 is a schematic view showing light-emitting states of the pixel units according to an embodiment of the present disclosure.

FIG. 4 shows the distribution of the pixel units, and FIG. 5 shows light-emitting states of the pixel units. When light beams are emitted by the pixel unit, due to the function layer 1, the pixel unit 1 may include a normal light-emitting area 201 and a light-shielding area 202. When the light beams emitted at the light-shielding area 202 are not shielded by the function layer 1, they may reach the windshield and generate a projection image on the windshield. Through the function layer 1, it is able to shield the light beams emitted at the light-shielding region 202, thereby to prevent the occurrence of the projection image on the windshield. The light beams emitted at the normal light-emitting region 201 may be received by the driver or the other user normally.

The function layer 1 may be of various structures. In the embodiments of the present disclosure, the function layer 1 may include an organic layer 12. The organic layer 12 may be formed on the thin film encapsulation layer 2 and include a plurality of protrusions. Each protrusion may be located on a respective one pixel unit 200, and a light-shielding layer 11 may be formed on a first portion of each protrusion so as to shield the light beams emitted by the pixel unit 200 toward the windshield.

The organic layer 12 may be formed through such processes as an exposure process and a developing process with a half-tone mask. The light-shielding layer 11 may be arranged on the first portion of each protrusion, and merely shield the light beams emitted by the pixel unit 200 toward the windshield rather than the light beams emitted by the pixel unit 200 toward the user's eye. As a result, it is able to prevent a line of sight of the driver or the other user from being adversely affected by the projection image on the windshield.

In the embodiments of the present disclosure, the first portion of each protrusion may be a curved-surface structure protruding in the first direction, and the first direction may be a direction away from the base substrate.

The first portion may have a gradient. The first portion may not be limited to the curved-surface structure, and it may also be a beveled smooth surface, as long as the light beams emitted by the pixel unit 200 toward the windshield may be shielded.

In a possible embodiment of the present disclosure, as shown in FIGS. 2 and 3, the light beams emitted by the pixel unit 200 may include the first light beams a in the first direction and the second light beams b toward a second direction, and the second direction may be a direction toward the user's eye. An angle of a marginal light beam in the first light beams a adjacent to the second light beams b relative to a direction perpendicular to the base substrate may be a second angle θ. As shown in FIG. 3, the light-shielding layer on each first portion may include a first end 101 adjacent to the base substrate 6 and a second end 102 distal to the base substrate 6, and an angle of a connection line connecting the second end 102 of one light-shielding layer and the first end 101 of an adjacent light-shielding layer relative to the direction perpendicular to the base substrate 6 may be a first angle $\theta_1$ which, as shown in FIG. 3, is the same as the second angle θ. An angle $\theta_0$ of the first end 101 of the light shielding layer adjacent to the base substrate 6 relative to a plane where the base substrate 6 is located may be calculated through equations $$\tan\theta_0 = \frac{h_2}{x} \text{ and } \tan\theta_1 = \frac{p-x}{h_2},$$

where $h_2$ represents a distance between the first end of the light-shielding layer and the second end of the light-shielding layer in a direction perpendicular to the display substrate, p represents a length of the pixel unit 200 in a row direction or a column direction, x represents a length of an orthogonal projection of the light-shielding layer 11 onto the base substrate 6 in a direction parallel to the base substrate 6, a direction of x may be parallel to a direction of p, and $\theta_1$ represents the first angle.

It should be appreciated that, in actual use, when the on-board display panel is located at different positions, angles between the on-board display panel and the windshield may be different, so the second angle may not be limited to an angle of the marginal light beam in the first light beams adjacent to the second light beams relative to the direction perpendicular to the display substrate.

It should be appreciated that, when the display substrate in the embodiments of the present disclosure is applied to an on-board display device, values of the distance $h_2$ between the second end 102 and the first end 101 of the light-shielding layer in the direction perpendicular to the display substrate may be different, depending on an arrangement of the on-board display device and a position relationship between the on-board display device and the windshield. In a possible embodiment of the present disclosure, the value of the distance $h_2$ between the second end 102 and the first end 101 of the light-shielding layer in the direction perpendicular to the display substrate may be equal to a value of a maximum thickness of the organic layer 12 in the direction perpendicular to the display substrate, i.e., the light-shielding layer 11 may, at an end distal to the base substrate 6, coincide with an uppermost end of the organic layer 12 distal to the substrate 6, so as to ensure that the light-shielding layer is capable of completely shielding the light beams emitted by the pixel unit 200 toward the windshield, thereby to prevent the occurrence of the projection image on the windshield.

In the embodiments of the present disclosure, the light-shielding layer 11 may be made of, but not limited to, a black light-resistant material.

In the embodiments of the present disclosure, the organic layer 12 may be formed through, but not limited to, a half-tone mask.

The thin film encapsulation layer 2 may be used to protect the pixel unit 200. When the organic layer 12 is directly formed on the thin film encapsulation layer 12, normal light emission of the pixel unit 200 may not be adversely affected. In addition, the thin film encapsulation layer 2 may be provided with a flat surface, so as to facilitate the formation of the organic layer 12.

The present disclosure further provides in some embodiments an on-board display device including the above-mentioned display substrate.

In the on-board display device, the display substrate may be an on-board display substrate. The function layer 1 is configured to shield the light beams emitted by at least one pixel unit 200 toward the windshield, so as to prevent the occurrence of a projection image of a display panel of the on-board display device on the windshield.

During the manufacture of the display substrate, the function layer 1 may be directly formed at a light-exiting side of the pixel unit 200, so as to improve the manufacture accuracy, align the function layer 1 with the corresponding pixel unit 200 in a more accurate manner, and shield the light beams emitted by the pixel unit 200 in a more accurate manner. Hence, it is able to prevent the occurrence of the light loss for the display panel, and as compared with the light control film, it is unnecessary to apply any adhesive onto the display panel, thereby to reduce a thickness of the display panel.

It should be appreciated that, the display substrate in the embodiments of the present disclosure may also be applied to any other application scenarios where an emergent angle of the light beam needs to be controlled, but not limited to the on-board display device.

The present disclosure further provides in some embodiments a method for manufacturing the display substrate, which includes: forming a plurality of pixel units on a base substrate; forming a thin film encapsulation layer on the pixel units; and forming a function layer on the thin film encapsulation layer to shield a light beam toward a first direction among light beams emitted by at least one pixel unit of the plurality of pixel units.

In a possible embodiment of the present disclosure, the forming the function layer on the thin film encapsulation layer to shield the light beam toward the first direction among the light beams emitted by the at least one pixel unit of the plurality of pixel units includes: forming an organic layer on the thin film encapsulation layer; exposing and developing the organic layer with a half-tone mask, to form a corresponding protrusion on the at least one pixel unit; and forming a light-shielding layer on a first portion of the protrusion.

The above embodiments are for illustrative purposes only, but the present disclosure is not limited thereto. Obviously, a person skilled in the art may make further modifications and improvements without departing from the principle of the present disclosure, and these modifications and improvements shall also fall within the scope of the present disclosure.

What is claimed is:

1. A display substrate, comprising:
a base substrate, a plurality of pixel units arranged on the base substrate, and a function layer arranged at a light-emitting side of at least one pixel unit of the plurality of pixel units,
wherein the function layer is configured to shield a light beam toward a first direction among light beams emitted by the at least one pixel unit, the function layer comprises an organic layer and a light-shielding layer, and the light-shielding layer is arranged on a part of the organic layer, and configured to shield the light beam toward the first direction among the light beams emitted by the at least one pixel unit;
wherein the organic layer comprises at least one protrusion, each of the at least one protrusion is arranged on a respective one of the at least one pixel unit, and a respective light-shielding layer is arranged on a first portion of each protrusion;
wherein the light-shielding layer on each first portion comprises a first end adjacent to the base substrate and a second end distal to the base substrate, and an angle of a connection line relative to a direction perpendicular to the base substrate is a first angle, wherein the connection line connects the second end of the light-shielding layer and a first end of another adjacent light-shielding layer, an angle $\theta_0$ of the first end of the light-shielding layer adjacent to the base substrate relative to a plane where the base substrate is located is calculated through equations $$\tan\theta_0 = \frac{h_2}{x} \text{ and } \tan\theta_1 = \frac{p-x}{h_2},$$

where $h_2$ represents a distance between the first end of the light-shielding layer and the second end of the light-shielding layer in a direction perpendicular to the display substrate, p represents a length of the pixel unit in a row direction or a column direction, x represents a length of an orthogonal projection of the light-shielding layer onto the base substrate in a direction parallel to the base substrate, a direction of x is parallel to a direction of p, and $\theta_1$ represents the first angle.

2. The display substrate according to claim 1, wherein the first portion of each protrusion is a curved-surface structure protruding in the first direction, and the first direction is a direction away from the base substrate.

3. The display substrate according to claim 1, wherein the light beams emitted by the at least one pixel unit comprise first light beams toward the first direction and second light beams toward a second direction, an angle of a marginal light beam in the first light beams relative to the direction perpendicular to the base substrate is a second angle, the marginal light beam is adjacent to the second light beams, and the second angle is the same as the first angle.

4. The display substrate according to claim 3, wherein the second direction is a direction toward a user's eye, and the second light beams toward the second direction are not shielded by the function layer.

5. The display substrate according to claim 1, wherein the light-shielding layer is made of a black light-resistant material.

6. The display substrate according to claim 1, wherein the pixel unit comprises an anode, a pixel light-emitting layer and a cathode arranged sequentially in a direction away from the base substrate, and a thin film encapsulation layer encapsulating the anode, the pixel light-emitting layer and the cathode, and the organic layer is formed on the thin film encapsulation layer.

7. The display substrate according to claim 6, wherein the organic layer is in direct physical contact with the thin film encapsulation layer, the light-shielding layer is merely arranged on a surface of the first portion of each protrusion, and the surface of the first portion is not in direct physical contact with the thin film encapsulation layer, to merely shield the light beam toward the first direction among the light beams emitted by the pixel unit.

8. An on-board display device, comprising the display substrate according to claim 1.

9. The on-board display device according to claim 8, wherein the display substrate is an on-board display substrate, and the first direction is a direction toward a windshield of a vehicle with the on-board display device.

10. The on-board display device according to claim 8, wherein the first portion of each protrusion is a curved-surface structure protruding in the first direction, and the first direction is a direction away from the base substrate.

11. The on-board display device according to claim 8, wherein the light beams emitted by the at least one pixel unit comprise first light beams toward the first direction and second light beams toward a second direction, an angle of a marginal light beam in the first light beams relative to the direction perpendicular to the base substrate is a second angle, the marginal light beam is adjacent to the second light beams, and the second angle is the same as the first angle.

12. The on-board display device according to claim 11, the second direction is a direction toward a user's eye, and the second light beams toward the second direction are not shielded by the function layer.

13. The on-board display device according to claim 8, wherein the light-shielding layer is made of a black light-resistant material.

14. The on-board display device according to claim 8, wherein the pixel unit comprises an anode, a pixel light-emitting layer and a cathode arranged sequentially in a direction away from the base substrate, and a thin film encapsulation layer encapsulating the anode, the pixel light-emitting layer and the cathode, and the organic layer is formed on the thin film encapsulation layer.

15. A method for manufacturing the display substrate according to claim 1, comprising:
   forming the plurality of pixel units on the base substrate;
   forming a thin film encapsulation layer on the pixel units; and
   forming the function layer on the thin film encapsulation layer, to shield the light beam toward the first direction among the light beams emitted by the at least one pixel unit of the plurality of pixel units.

16. The method according to claim 15, wherein the forming the function layer on the thin film encapsulation layer to shield the light beam toward the first direction among the light beams emitted by the at least one pixel unit of the plurality of pixel units comprises:
   forming an organic layer on the thin film encapsulation layer;
   exposing and developing the organic layer with a half-tone mask, to form a respective protrusion on the at least one pixel unit; and
   forming the light-shielding layer on a first portion of the protrusion.

\* \* \* \* \*